United States Patent [19]
Knappe et al.

[11] Patent Number: 5,215,312
[45] Date of Patent: Jun. 1, 1993

[54] HOUSING WITH A PRESSURE-EQUALIZING ELEMENT WHICH IS RETAINED WATER-TIGHTLY AROUND THE EDGES WITHIN A HOUSING WALL OPENING

[75] Inventors: Wolfram Knappe, Kitzingen; Peter Michel, Kleinrinderfeld, both of Fed. Rep. of Germany

[73] Assignee: Siemens Aktiengesellschaft, Munich, Fed. Rep. of Germany

[21] Appl. No.: 836,152

[22] Filed: Feb. 13, 1992

Related U.S. Application Data

[63] Continuation of Ser. No. 576,282, Aug. 3, 1990, abandoned.

[30] Foreign Application Priority Data

Sep. 14, 1989 [EP] European Pat. Off. ........ 89117054.0

[51] Int. Cl.⁵ .................... F16T 1/20; B65D 51/16
[52] U.S. Cl. .......................... 277/1; 137/197; 137/199; 215/261; 220/373
[58] Field of Search ............... 137/197, 199; 220/373; 215/261, 307, 308; 277/1

[56] References Cited

U.S. PATENT DOCUMENTS

| | | | |
|---|---|---|---|
| 3,507,708 | 4/1970 | Vignaud | 220/373 |
| 3,805,991 | 4/1974 | Cheladze et al. | 220/373 |
| 4,071,040 | 1/1978 | Moriarty | 137/199 |
| 4,596,338 | 6/1986 | Yousif | 215/261 |
| 4,624,286 | 11/1986 | Frohn | 220/373 |
| 4,794,942 | 1/1989 | Yasuda et al. | 137/197 |

FOREIGN PATENT DOCUMENTS

| | | |
|---|---|---|
| 7040982 | 1/1971 | Fed. Rep. of Germany . |
| 8707254 | 11/1988 | Fed. Rep. of Germany . |
| 44311 | 3/1966 | German Democratic Rep. . |

Primary Examiner—William A. Cuchlinski, Jr.
Assistant Examiner—Daniel G. DePumpo
Attorney, Agent, or Firm—Kenyon & Kenyon

[57] ABSTRACT

A pressure equalizing membrane made of gas permeable, water impermeable polytetrafluoroethlyene is pre-assembled to a retaining ring and the ring retained within a housing wall with a watertight seal. Either a one or two part retaining ring is used as a holder for the PTFE membrane. The retaining ring is provided with at least one circumferential elastic sealing lip about its periphery for providing a press fit of the membrane and retaining ring assembly into the housing wall opening, and for providing a watertight seal about the membrane.

17 Claims, 1 Drawing Sheet

HOUSING WITH A PRESSURE-EQUALIZING ELEMENT WHICH IS RETAINED WATER-TIGHTLY AROUND THE EDGES WITHIN A HOUSING WALL OPENING

This application is a continuation of application Ser. No. 07/576,282, filed Aug. 31, 1990, now abandoned.

BACKGROUND OF THE INVENTION

This invention relates generally to a housing with a pressure-equalizing element for preventing water from entering the housing, while still allowing for gaseous pressure to equalize on either side of the element. More particularly, the invention relates to a mechanically simple and reliable device for providing such selective sealing for a gear housing.

A pressure-equalizing element in the form of a conventional GORE-TEX ® PTFE (polytetrafluoroethylene) membrane is disclosed in DE-U1-87 07 254. In this device, the membrane is inserted from the outside into the counterbored hole of a gear housing for a vehicle window actuator until it reaches a support shoulder. Further movement of the membrane in the opposite direction is prevented by use of a sealing ring placed in between the membrane and a counter-pressing spring lock washer. The spring lock washer locks into the counterbored housing hole when it reaches its final position. The dish-shaped spring lock washer is provided with a curved dish base which arches into the area of the dish.

Although this seal works well, the problem of further developing a pressure equalizing sealing structure that is simpler in construction and provides a more reliable seal against water, is still presented.

SUMMARY OF THE INVENTION

The invention solves this problem by providing a retainer and pressure equalizing element for an opening in a housing. The pressure equalizing element is a gas-permeable membrane that is both impermeable to water and permeable to gas. Such a membrane, properly positioned within the housing opening, prevents water from infiltrating into the housing while allowing for the equalization of pressure on both sides of the membrane.

The membrane is held in place by a retaining ring that holds the membrane about its edges. For ease of construction and to facilitate insertion of the membrane into the housing opening, the membrane is preassembled onto the retaining ring. The retaining ring has at least one circumferential elastic sealing lip disposed about its outer portion adapted for insertion into the housing opening. This lip serves both to lock the membrane in place within the opening, and to prevent any liquid from leaking across the periphery of the water impermeable membrane. By combining the membrane, retaining, locking, and sealing functions in one easy to insert pre-assembled element, one reduces the likelihood that the membrane will be damaged during insertion. No further separate sealing element need be inserted.

In order to preassemble the membrane within the retaining ring in a simple manner, the retaining ring is provided with a circumferential contact shoulder to which the outer periphery of the membrane is affixed during preassembly. This attachment of the membrane to the retaining ring is done in a watertight manner. Such well known means of attachment as bonding, welding, injection, caulking, or a combination of these methods, can be employed to affix the membrane to the retaining ring.

The retaining ring may be designed in two pieces instead of one. In this case, both parts of the retaining ring may be fitted together during preassembly, so that the membrane is effectively sandwiched between the contact shoulders of both retaining ring parts in a watertight manner.

In order to protect the membrane from external damage during assembly or operation, the retaining ring or the retaining ring parts are provided on their outer faces with coverings—in particular in the form of struts—which protect the membrane face. The protective coverings, as well as the external sealing lips, are molded in one piece as plastic injection molded parts during the production of the retaining rings.

DETAILED DESCRIPTION

Figure 1:
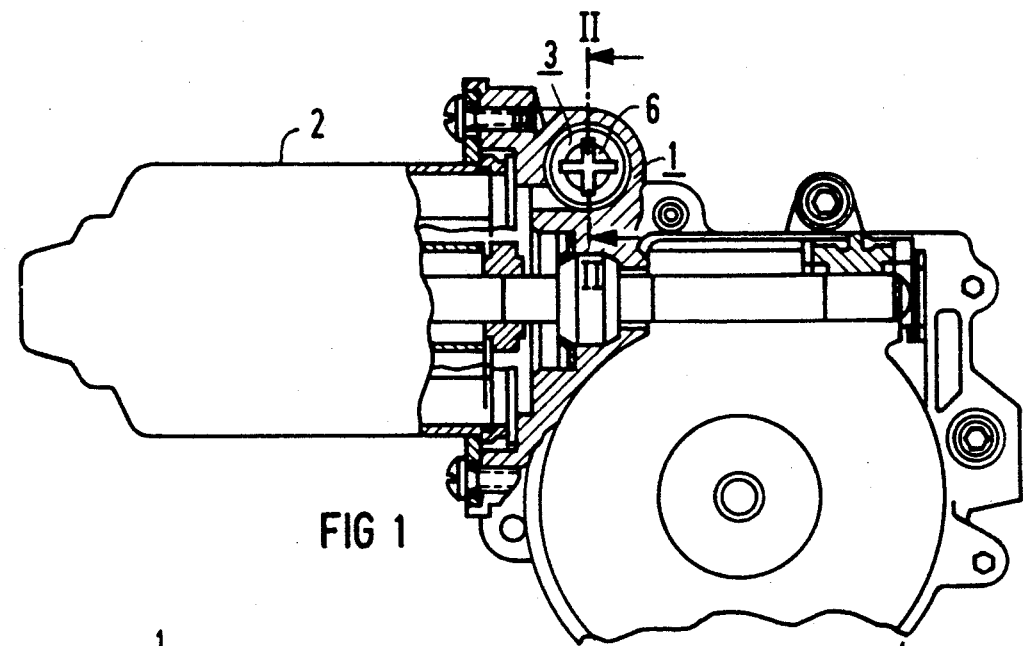
FIG. 1 is an axial part-sectional view of a window actuating drive mechanism for a vehicle with a pressure equalizing element mounted in a gear housing constructed according to the principles of the invention.

FIG. 1 shows a window actuating drive mechanism with a gear housing 1 that accommodates a worm gear and the motor housing 2 of a commutator motor that is screwed onto this gear housing. The gear housing 1 has a wall opening, which is closed by a pressure-equalizing element 6 in the form of a PTFE membrane. This membrane allows an exchange of gas to take place across the membrane, thus equalizing pressure on the inside and outside of the housing, while preventing water from penetrating into the gear housing. To prevent such leakage of water, the membrane must also be retained about its periphery within the housing wall opening in a watertight manner.

Figures 2, 3:
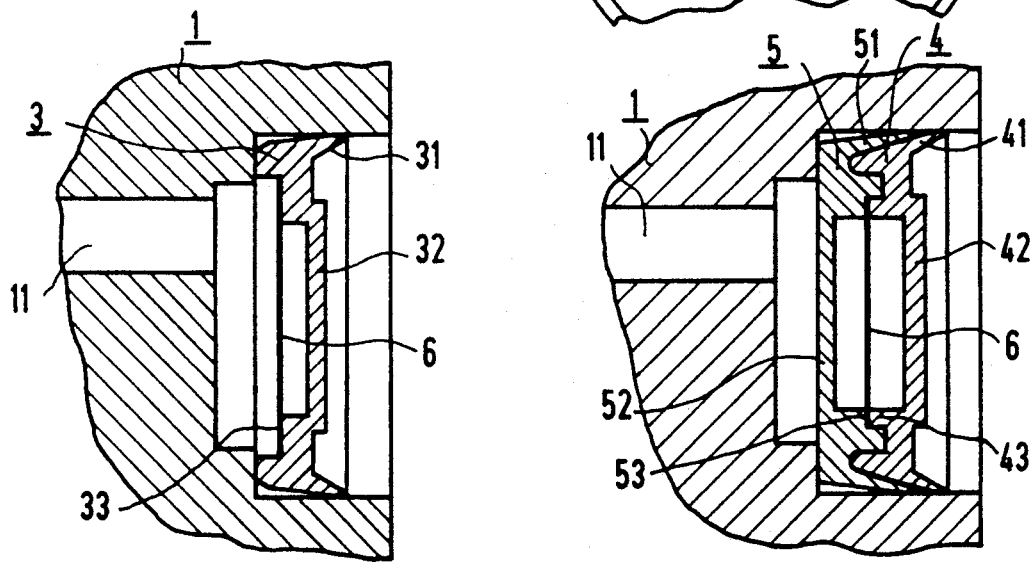
FIG. 2 is a partial sectional view taken along line II—II of FIG. 1, showing a sealing structure constructed according to a first embodiment of the invention.
FIG. 3 is a partial sectional view taken along line II—II of FIG. 1, showing a sealing structure constructed according to a second embodiment of the invention.

FIGS. 2 and 3 show two different embodiments of a retaining ring according to the invention that has been inserted into the wall opening of the gear housing 1, whereby the housing wall opening is connected to the interior of the gear housing by way of a through-hole 11.

FIG. 2 shows a one-piece retaining ring 3 with a support shoulder 33. The PTFE membrane has been bonded onto this support shoulder 33 so as to establish a watertight seal between these elements. The retaining ring 3 with the preassembled PTFE membrane 6 is inserted from the outside into the housing wall opening until reaching the base of the housing wall opening. The retaining ring 3 is fixed in this final position against movement in an axially opposing direction (i.e., to the right in the figures) by means of a circumferential elastic sealing lip 31. This lip is angled with respect to the direction of insertion of the retaining ring 3 in the housing wall opening, and has a greater outer diameter before insertion than the inside width of the housing wall opening. The insertion of such structure to its final position assures both a press fit of the retaining ring 3 in its final position and the watertight mounting of the retaining ring 3 within the housing.

FIG. 3 shows a second embodiment of the retaining ring. This embodiment uses a two-piece retaining ring that consists of a first retaining ring part 4, and a second retaining ring part 5. The retaining ring parts 4 and 5 have axially protruding clamping ridges or corresponding clamping grooves such that both retaining rings 4 and 5 can be fitted together axially. As with the embodiment of FIG. 2, a PTFE membrane 6 is affixed to a contact shoulder 43 or 53 of the retaining ring 4 or 5 in a watertight manner. The membrane is then sandwiched between the retaining ring parts.

Figure 4:
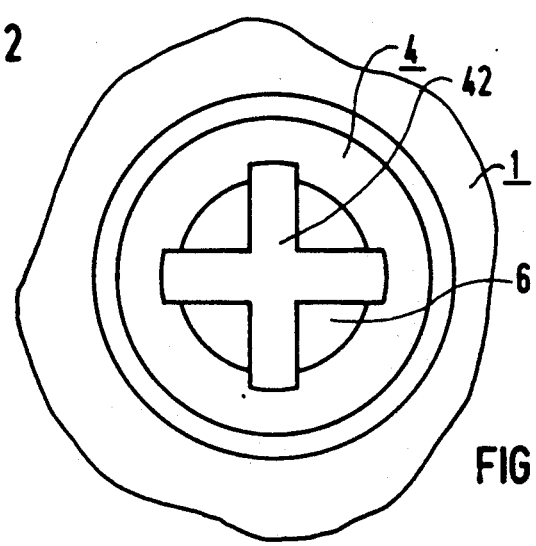
FIG. 4 is a frontal top view of the housing wall opening with the inserted retaining disk according to FIG. 2 or FIG. 3.

It is desirable to provide external mechanical protection of the PTFE membrane during assembly or in later operation. Such protection may be obtained by providing the retaining rings of the first or second embodiments with protective struts 32, 42, or 52. Such struts serve to protect the face of the PTFE membrane. These protective struts, as can be seen in FIG. 4, are arranged in a cross shape.

The retaining rings advantageously consist of plastic injection molded parts with sealing lips that are molded in one piece. The protective struts too, may be molded as one piece with the rest of the retaining ring.

What is claimed is:

1. An assembly comprising:
   a housing containing a bore having an opening;
   a retaining ring having at least one circumferential, elastic sealing lip disposed about the outer portion of said retaining ring, said bore having a depth sufficient to contain said retaining ring so that the elastic sealing lip presses against the bore in a locked, watertight configuration; and
   a gas-permeable membrane that is impermeable to water and permeable to gas preassembled onto the retaining ring, whereby the membrane and retaining ring will prevent the infiltration of water into the opening while allowing for the equilization of gaseous pressure across the membrane.

2. The assembly of claim 1, wherein the retaining ring has a circumferential contact shoulder on which the membrane is preassembled in a sealing relationship on the side of the retaining ring facing the housing.

3. The assembly of claim 1, wherein said retaining ring includes first and second parts axially assembled and the membrane is sealingly held between said first and second retaining ring parts.

4. The assembly of claim 3, wherein each of the first and second axially assembled retaining ring parts is provided with at least one circumferential sealing lip about its periphery.

5. The assembly of claim 1, wherein the outer diameter of the rim of the sealing lip has a diameter in its uninserted state greater than the inner diameter of the housing opening into which the sealing lip is inserted.

6. The assembly of claim 1, wherein the sealing lip of the retaining ring in its uninserted has a conical outer surface that tapers in the direction of the bore.

7. The assembly of claim 1, wherein at least that face of the retaining ring that faces out from the housing opening is provided with a protective covering in the form of a protective strut to shield the membrane.

8. The assembly of claim 3, wherein said first and second retaining ring parts interlock axially.

9. The assembly of claim 1, wherein the membrane is made of polytetrafluoroethylene.

10. The assembly of claim 1, wherein the retaining ring and sealing lip are a unitary plastic part.

11. The assembly of claim 7, wherein the retaining ring, sealing lip, and protective covering are a unitary plastic part.

12. The assembly of claim 4, wherein the outer diameter of the rim of the sealing lip has a diameter in its uninserted state greater than the inner diameter of the housing opening into which the sealing lip is inserted.

13. The assembly of claim 4, wherein the sealing lip of the ring in its uninserted configuration is angled with respect to the direction of insertion.

14. The assembly of claim 3, wherein at least that face of the retaining ring that faces the housing opening is provided with a protective covering in the form of a protective strut to shield the membrane.

15. The assembly of claim 14, wherein the housing contains a gear assembly.

16. A method for sealing a housing having bore having an opening against the flow of water while allowing for the equalization of gaseous pressure on either side of the seal, comprising the steps of:
   preassembling a membrane that is permeable to gas and impermeable to water in a watertight manner to a retaining ring having an outer circumferential sealing lip; and
   inserting the retaining ring into the housing opening, with a watertight press fit between the housing opening and the retainer sealing lip.

17. The method of claim 16, wherein the housing contains a gear assembly to be sealed against water.